US012701965B2

(12) United States Patent
Schier et al.

(10) Patent No.: US 12,701,965 B2
(45) Date of Patent: Aug. 4, 2026

(54) APPARATUS FOR PROCESSING A WAFER-SHAPED ARTICLE

(71) Applicant: LAM RESEARCH AG, Villach (AT)

(72) Inventors: Burkhart Schier, Klagenfurt (AT);
Michael Brugger, Millstatt (AT);
Wolfgang Krautzer, Thoerl-Maglern
(AT); Thomas Passegger, Villach (AT)

(73) Assignee: LAM RESEARCH AG, Villach (AT)

( * ) Notice: Subject to any disclaimer, the term of this
patent is extended or adjusted under 35
U.S.C. 154(b) by 288 days.

(21) Appl. No.: 18/277,441

(22) PCT Filed: Feb. 17, 2022

(86) PCT No.: PCT/EP2022/053954
§ 371 (c)(1),
(2) Date: Aug. 16, 2023

(87) PCT Pub. No.: WO2022/175391
PCT Pub. Date: Aug. 25, 2022

(65) Prior Publication Data
US 2024/0304489 A1 Sep. 12, 2024

(30) Foreign Application Priority Data
Feb. 18, 2021 (GB) ..................................... 2102290

(51) Int. Cl.
*H10P 72/76* (2026.01)
*H10P 72/50* (2026.01)
(52) U.S. Cl.
CPC .......... *H10P 72/7608* (2026.01); *H10P 72/53*
(2026.01)
(58) Field of Classification Search
CPC ..... H01L 21/681; H01L 21/687; H01L 21/21;
H01L 21/6831; H01L 21/6835
See application file for complete search history.

(56) References Cited

U.S. PATENT DOCUMENTS 5,513,668 A * 5/1996 Sumnitsch .......... H01L 21/6838
134/153
6,184,972 B1 * 2/2001 Mizutani ............... G03F 7/7075
269/21

(Continued)

FOREIGN PATENT DOCUMENTS

| JP | H0523542 U | 3/1993 |
| KR | 10-2009-0027418 A | 3/2009 |
| TW | 200822274 A | 5/2008 |

OTHER PUBLICATIONS

International Search Report and Written Opinion of the ISA issued
in PCT/EP2022/053954, mailed Jun. 3, 2022; ISA/EP.

(Continued)

*Primary Examiner* — Lee D Wilson

(57) ABSTRACT

Apparatus for processing a wafer-shaped article, the appa-
ratus comprising a support configured to support the wafer-
shaped article during a processing operation to be performed
on the wafer-shaped article; wherein: the support comprises
a support body and a plurality of gripping pin assemblies
adapted and positioned relative to the support body for
gripping the wafer-shaped article, wherein the gripping pin
assemblies are rotatable between a gripping configuration in
which the gripping pin assemblies are arranged to grip the
wafer-shaped article, and a non-gripping configuration in
which the gripping pin assemblies are not arranged to grip
the wafer-shaped article; and the apparatus comprises a
detector configured to directly or indirectly detect a con-
figuration of the gripping pin assemblies.

17 Claims, 13 Drawing Sheets

(56)         References Cited

U.S. PATENT DOCUMENTS

| | | | |
|---|---|---|---|
| 11,806,823 B2 * | 11/2023 | Takitani | B23Q 1/0027 |
| 12,129,131 B2 * | 10/2024 | Watanabe | H01L 21/681 |
| 2001/0043858 A1 | 11/2001 | Bacchi et al. | |
| 2004/0159343 A1 | 8/2004 | Shimbara et al. | |
| 2010/0200163 A1 * | 8/2010 | Puggi | H01L 21/67051 |
| | | | 156/345.23 |
| 2011/0148022 A1 * | 6/2011 | Brugger | H01L 21/68757 |
| | | | 269/296 |
| 2011/0254236 A1 * | 10/2011 | Brugger | H01L 21/68792 |
| | | | 279/125 |
| 2012/0298149 A1 | 11/2012 | Puggl | |
| 2013/0127102 A1 * | 5/2013 | Kinoshita | H01L 21/6838 |
| | | | 29/559 |
| 2015/0083038 A1 | 3/2015 | Furuya | |
| 2016/0172256 A1 | 6/2016 | Rose et al. | |
| 2018/0151407 A1 | 5/2018 | Stone | |
| 2024/0304489 A1 * | 9/2024 | Schier | H01L 21/67253 |

OTHER PUBLICATIONS

Office Action issued in corresponding Taiwanese Application No. 111105764 dated May 13, 2025.
Office Acton issued in corresponding Korean App. No. 10-2023-7031679 dated Jul. 22, 2025.
Exam Report in corresponding European Application No. 227105269 dated Feb. 9, 2026.

* cited by examiner

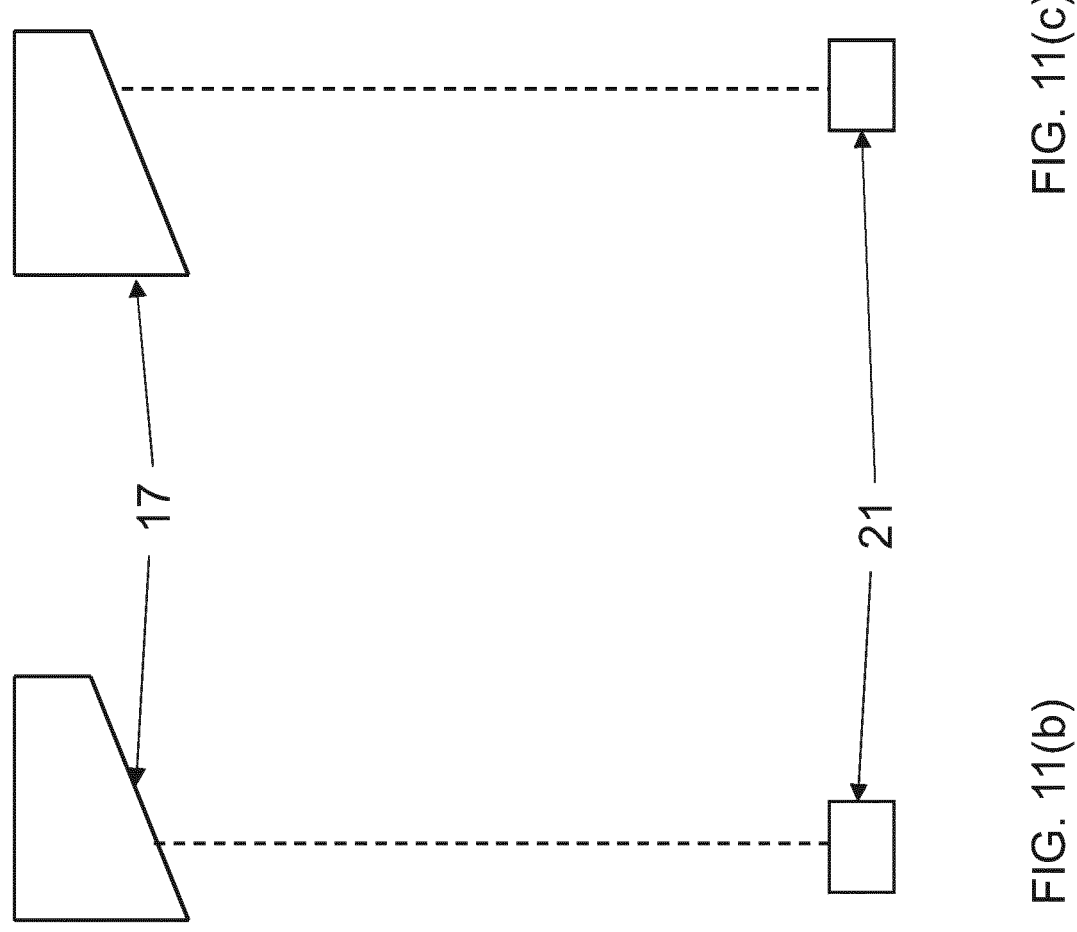
FIG. 11(c)
FIG. 11(b)
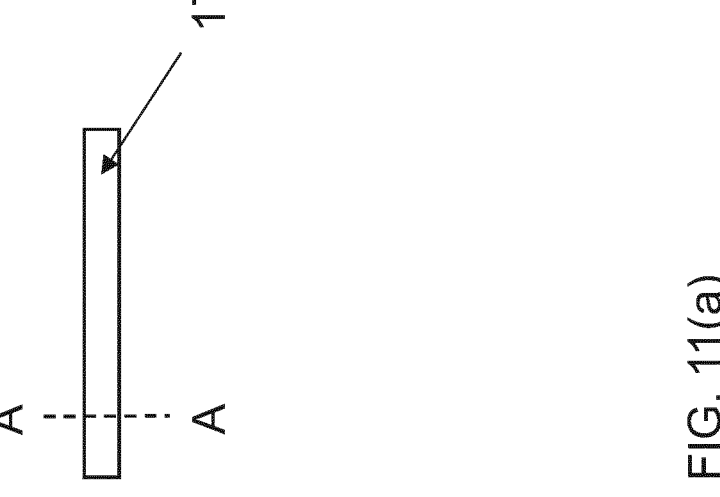
FIG. 11(a)

APPARATUS FOR PROCESSING A WAFER-SHAPED ARTICLE

CROSS-REFERENCE TO RELATED APPLICATIONS

This application is a U.S. National Phase Application under 35 U.S.C. 371 of International Application No. PCT/EP2022/053954, filed on Feb. 17, 2022, which claims the benefit of Great Britain Patent Application No. GB 2102290.0, filed on Feb. 18, 2021. The entire disclosures of the applications referenced above are incorporated herein by reference.

FIELD OF THE INVENTION

The present invention relates to an apparatus for processing a wafer-shaped article, such as a semiconductor wafer.

BACKGROUND OF THE INVENTION

Wafers such as semiconductor wafers may be subjected to various surface treatment processes, such as etching, cleaning, polishing and material deposition. A wafer is typically supported and gripped using a chuck while undergoing such surface treatment processes.

At least some of these surface treatment processes involve applying a liquid to a surface of the wafer. For example, the surface of the wafer may be etched by applying a processing liquid such as hydrofluoric acid to selected locations on the surface of the wafer. Alternatively, the surface of the wafer may be cleaned by applying a cleaning liquid or rinse liquid such as isopropyl alcohol or de-ionised water to the surface of the wafer.

The wafer may be spun when the liquid is applied to the surface of the wafer, for example using a rotatable chuck, to assist distribution of the liquid over the surface of the wafer. Where the liquid is a cleaning liquid or a rinse liquid, such a process may be referred to as a spin-clean process.

In addition, the surface of the wafer may subsequently be dried by heating the wafer to cause evaporation of the liquid on the surface of the wafer, for example by using heating elements in the chuck to heat an underside of the wafer.

FIGS. 1 and 2 are simplified cross-sectional illustrations of an apparatus for processing a wafer-shaped article that has previously been used by the applicant.

As shown in FIGS. 1 and 2, the apparatus 1 comprises a chuck 2 for holding a wafer W. The chuck 2 comprises a chuck body 3 that has a top surface 4 for receiving and supporting the wafer W.

The chuck 2 is typically mounted on a rotatable shaft, which can be driven to rotate by a motor. Therefore, the chuck 2 and thus the wafer W held by the chuck 2 can be driven to rotate using the motor. The chuck 2 may therefore be referred to as a spin chuck.

In practice, the chuck 2 will be positioned within a processing chamber, to isolate the processing environment around the wafer W from an external environment.

Typically, a liquid dispenser is located above the top surface 4 of the chuck body 3 for dispensing a processing liquid onto a top surface of the wafer W held by the chuck 2.

Typically, heating elements such as LEDs are included in the chuck body 3 for heating an underside of the wafer W held by the chuck 2.

The chuck 2 comprises a plurality of pin assemblies 5 that are operable to grip the periphery of the wafer W that is positioned on the top surface 4 of the chuck body 3.

Each of the pin assemblies 5 is partly (mainly) positioned in a respective hole in the top surface 4 of the chuck body 3, and is rotatable within the hole around a longitudinal axis (vertical axis) of the pin assembly 5.

As shown in FIGS. 3A and 3B, each of the pin assemblies 5 comprises a substantially cylindrical main body 6, a first gear 7 at a first end of the main body 6 (a first longitudinal end, which is a bottom end of the main body 6), and an eccentric longitudinal protrusion 8 at a second end of the main body 6 (a second longitudinal end, which is a top end of the main body 6).

The longitudinal protrusion 8 extends longitudinally from the second end of the main body 6 and is spaced apart from a longitudinal axis of the main body 6, so as to be off-set relative to the longitudinal axis of the main body 6. The longitudinal protrusion 8 is substantially cylindrical, and has a smaller diameter than the main body 6. At least the eccentric longitudinal protrusion 8 protrudes out of the hole from the top surface 4 of the chuck body 3.

As shown in FIGS. 4A to 4C, which are simplified plan views of the apparatus of FIG. 1 with different configurations of the pin assemblies, the pin assemblies 5 are positioned on the top surface 4 of the chuck body 3 in a circular series surrounding an area where the wafer W is to be positioned on the top surface 4.

As shown in FIGS. 1 and 2, a second gear 9 (a gear ring) is provided in the chuck body 3 and is meshed or engaged with each of the first gears 7 of the pin assemblies 5, such that rotation of the second gear 9 causes synchronised rotation of each of the first gears 7, and therefore synchronised rotation of each of the pin assemblies 5 around the respective longitudinal axes of the pin assemblies 5.

The second gear 9 is rotatably mounted in the chuck body 3 by one or more bearings 10. The second gear 9 is coupled to an electric motor, for example via a rotor shaft, such that the second gear 9 can be driven to rotate by the electric motor.

Rotation of the pin assemblies 5 around their longitudinal axes causes the eccentric longitudinal protrusions 8 at the second longitudinal ends of the pin assemblies 5 to move closer to, or further away from, a centre of the top surface 4 of the chuck body 3.

References in this application to the centre of the top surface 4 of the chuck body 3 may refer to a position on the top surface 4 of the chuck body 3 where the centre of the wafer W is located when the wafer is loaded on the top surface 4. The wording "centre of the top surface 4 of the chuck body 3" may therefore be replaced with the wording "a position on the top surface 4 of the chuck body 3 where the centre of the wafer W is located when the wafer is loaded on the top surface 4".

The rotational orientations or positions of the pin assemblies 5 are synchronised together so that when the pin assemblies 5 are rotated, a distance between the longitudinal protrusion 8 and the centre of the top surface 4 is the same for all of the pin assemblies 5.

FIG. 4A shows the pin assemblies 5 in a fully open position, where the longitudinal protrusions 8 are at a maximum distance from the centre of the top surface 4 of the chuck body 3. This is an example of a non-gripping configuration of the pin assemblies 5. Of course, there may be more than one non-gripping configurations of the pin assemblies.

When a wafer W is positioned on the top surface 4, rotating the pin assemblies 5 so as to cause the eccentric longitudinal protrusions 8 to move closer to the centre of the chuck 2 causes the eccentric longitudinal protrusions 8 to contact the outer edge of the wafer W, to thereby grip the outer edge of the wafer W and laterally restrain the wafer W. An example of such a configuration is shown in FIG. 2 and FIG. 4B. This is an example of a gripping configuration of the pin assemblies. Of course, the longitudinal protrusions 8 may contact the edge of the wafer W at a different rotational position of the pin assemblies 5 to that shown in FIG. 2 and FIG. 4B.

As shown in FIG. 2 and FIG. 4B, the longitudinal protrusions contact the edge of the wafer W when the longitudinal protrusions are part way between the maximum distance of the longitudinal protrusions 8 from the centre of the top surface 4 and a minimum distance of the longitudinal protrusions from the centre of the top surface 4 (which is discussed below in relation to FIG. 4C).

The specific rotational positions of the pin assemblies 5 where the longitudinal protrusions 8 contact the edge of the wafer W is predetermined in advance based on the positioning and/or properties of the pin assemblies 5 and the diameter of the wafer W. Therefore, the gripping configuration of the pin assemblies 5 is predetermined in advance.

FIG. 4C shows the pin assemblies 5 in a fully closed position, where the longitudinal protrusions 8 are at a minimum distance from the centre of the top surface 4 of the chuck body 3. This configuration of the pin assemblies 5 can typically only be adopted by the pin assemblies 5 when no wafer is present.

Conversely, rotating the pin assemblies 5 so as to cause the eccentric longitudinal protrusions 8 to move further away from the centre of the chuck 2 means that the eccentric longitudinal protrusions 8 do not contact the outer edge of the wafer W. An example of this configuration is shown in FIGS. 1 and 4A (with the wafer omitted).

The second gear 9 may be configured to rotate around a predetermined number of degrees in a specific rotational direction that corresponds to rotating the pin assemblies 5 from a first non-gripping configuration, to a gripping configuration, to a second non-gripping configuration. For example, the second gear 9 may be configured to rotate around a predetermined number of degrees that corresponds to rotating the pin assemblies 5 360 degrees, so that the first and second non-gripping configurations are the same.

The chuck 2 may comprise a plurality of gas nozzles in the chuck body 3 having outlets in the top surface 4 of the chuck body 3. The gas nozzles may all be connected to a gas distribution chamber within the chuck body 3. Therefore, gas supplied to the gas distribution chamber is dispensed through the gas nozzles to the top surface 4 of the chuck body 3 from the outlets.

The outlets of the gas nozzles may be arranged on the top surface 4 of the chuck body 3 in a circular arrangement around a centre of the top surface 4.

The outlets of the gas nozzles may all be arranged in a peripheral zone or region of the top surface 4 of the chuck body 3. The outlets of the gas nozzles may all be closer to a periphery of the top surface 4 than a centre of the top surface 4.

Each of the gas nozzles may be angled outwards away from a central axis of the chuck 2. In other words, the gas nozzles may be angled radially outwards. Specifically, each of the gas nozzles may be angled so that the gas exits the outlet at an acute angle to the top surface 4 of the chuck body 3.

The outlets of the gas nozzles may be arranged on the top surface 4 so as to be covered by a peripheral zone or region of the wafer W when the wafer W is positioned on the top surface 4 of the chuck body 3 and supported by the chuck 2.

This configuration of the gas nozzles and outlets means that when a wafer W is positioned on the top surface 4 of the chuck body 3, and a compressed gas such as Nitrogen gas is supplied through the gas nozzles out of the outlets, the wafer W is held in a freely floating fashion above the top surface 4 in a state of equilibrium on account of the vacuum or low pressure produced beneath the wafer W by the gas exiting from the outlets due to Bernoulli's principle.

The wafer W may therefore be held in a freely floating fashion above the top surface 4 of the chuck body 3 supported on a gas cushion and may therefore not come into physical contact with the top surface 4 of the chuck body 3.

Gas may be supplied to the gas distribution chamber through an opening in a bottom surface of the chuck body 3 that leads to the gas distribution chamber. For example, a shaft having a channel or passageway for supplying the gas may be inserted into the opening.

The plurality of pin assemblies 5 may therefore be operable to grip the periphery of the wafer W while it is supported from beneath by the gas cushion.

However, it is not essential for the chuck 2 to include such an arrangement for supporting the wafer W on a gas cushion. For example, the wafer W may instead be supported from beneath by the pin assemblies 5 so as to be spaced apart from the top surface 4 of the chuck body 3, or may be in contact with the top surface 4 of the chuck body 3.

It is desirable to detect whether or not a wafer W is present on the top surface 4 of the chuck body 3, for example to detect when a wafer W is loaded or unloaded on the chuck 2, and/or to detect if a wafer W is lost (for example dropped or fallen off of an end effector being used to transport the wafer onto the chuck 2) or broken while on the chuck 2. For example, the apparatus 1 may be configured to automatically process a wafer W when it is detected that the wafer W is present on the top surface 4 and is not lost or broken. Processing of broken or lost wafers is undesirable, since such wafers will need to be scrapped and therefore such processing is wasted. Furthermore, when a wafer is broken or lost the apparatus will need to be examined and the broken or lost wafer (and/or any debris therefrom) will need to be removed. Therefore, it is desirable to detect when a wafer is broken or lost on the apparatus.

The apparatus 1 comprises a light source 11 beneath the chuck 2 and a light sensor 12 above the chuck 2. A light path 13 extends through the chuck 2 from the light source 11 to the light sensor 12. Of course, another type of electromagnetic radiation can be used instead of visible light. The apparatus 1 comprises a vertical passageway 14 that extends along a longitudinal axis of the chuck body 3 that is used to supply a gas to the top surface 4 of the chuck body 3, and the light path 13 extends along this passageway 14. For example, the vertical passageway 14 may by used to supply gas to the gas distribution chamber discussed above, and/or to the gas nozzles described above. Furthermore, the apparatus 1 comprises a transparent window 15 in the centre of the top surface 4 of the chuck body 3 where the light path 13 intersects the top surface 4 of the chuck body 3. Light can therefore travel from the light source 11 to the light sensor 12 along the light path 13 through the passageway 14 and transparent window 15.

Typically, when no wafer W is present on the top surface 4 of the chuck body 3, this light path 13 is not obstructed or interrupted. Therefore, the light sensor 12 will detect the light emitted by the light source 11. The apparatus 1 therefore determines that no wafer W is present on the top surface 4 when the light sensor 12 detects the light emitted by the light source 11.

In contrast, typically, when a wafer W is present on the top surface 4 of the chuck body 3, as illustrated in FIG. 2. the light path 13 is interrupted by the wafer W, such that light emitted by the light source 11 is not detected by the light sensor 12. The apparatus 1 therefore determines that a wafer W is present on the top surface 4 when the light sensor 12 detects the light emitted by the light source 11.

Therefore, the presence of a wafer W on the top surface 4 of the chuck body 3 can be detected by detecting that the light path 14 has been interrupted, i.e. that the light sensor 12 does not detect the light emitted by the light source 11.

Furthermore, when a wafer W breaks or is lost while on the top surface 4, light may again be able to pass along the light path 13 from the light source 11 to the light sensor 12. Therefore, with this arrangement it is possible to detect breakage or loss of the wafer W, in some cases, such that processing of the wafer W can then be stopped and processing of the damaged or lost wafer prevented.

SUMMARY OF THE INVENTION

The present inventors have realised that the arrangement for detecting whether or not a wafer W is present on the top surface 4 of the chuck body 3 described above does not work effectively in some circumstances.

For example, when the wafer W is a transparent wafer, such as a glass wafer, the wafer W does not interrupt the light path 13 and therefore the presence of the wafer W is not detected.

Furthermore, if the wafer W is broken or lost but still covers the centre of the front surface 4, the light path 13 is interrupted such that presence of a wafer is detected and the loss or breakage of the wafer W is not properly detected. In this case, the apparatus may continue to process the broken or lost wafer W, which is not desirable.

Furthermore, in some applications processing liquid is dispensed directly above the centre of the top surface 4. in this case, even if no wafer W is present on the top surface 4, or the wafer W is lost or broken, the processing liquid may sufficiently interrupt the light path 13 that the apparatus incorrectly determines that a wafer is present, even if no wafer if actually present.

The present invention may address one or more of these problems. However, the present invention does not need to address all of these problems.

At its most general, the present invention relates to indirectly determining that a wafer is present on the top surface by directly or indirectly detecting a configuration of the pin assemblies. In particular, if the pin assemblies are in a configuration for gripping the wafer, it can be assumed that a wafer has been loaded on the top surface. Conversely, if the pin assemblies are not in a configuration for gripping the wafer, it can be assumed that a wafer has not been loaded on the top surface. Therefore, by directly or indirectly detecting a configuration of the pin assemblies, it can be deduced whether or not a wafer is present on the top surface.

According to the present invention, there is provided an apparatus for processing a wafer-shaped article, the apparatus comprising a support configured to support the wafer-shaped article during a processing operation to be performed on the wafer-shaped article; wherein:

the support comprises a support body and a plurality of gripping pin assemblies adapted and positioned relative to the support body for gripping the wafer-shaped article, wherein the gripping pin assemblies are rotatable between a gripping configuration in which the gripping pin assemblies are arranged to grip the wafer-shaped article, and a non-gripping configuration in which the gripping pin assemblies are not arranged to grip the wafer-shaped article; and the apparatus comprises a detector configured to directly or indirectly detect a configuration of the gripping pin assemblies.

The present invention may have any one, or, to the extent they are compatible, any combination of the following optional features.

The wafer-shaped article may be a semiconductor wafer.

Being wafer-shaped may mean that the article has a circular disc shape.

Processing of the wafer-shaped article may comprise etching of the wafer-shaped article, for example etching of a semiconductor wafer using HF acid, or rinsing or cleaning of the wafer-shaped article, for example using deionised water.

The support may comprise a chuck.

The support may be a rotatable support, such as a rotatable chuck, for rotating the wafer-shaped article supported by the support.

The support supporting the wafer-shaped article may mean holding the wafer-shaped article, gripping the wafer-shaped article, restraining movement of the wafer-shaped article, constraining movement of the wafer-shaped article, and/or contacting the wafer-shaped article.

For example, supporting the wafer-shaped article may comprise restraining or preventing lateral movement of the wafer-shaped article.

The gripping pin assemblies may grip the wafer-shaped article from a side or edge of the wafer-shaped article (i.e. from a circumferential edge), and/or from below (i.e. from a main surface) of the wafer-shaped article. By gripping the wafer-shaped article from the side or edge of the wafer-shaped article, the gripping pin assemblies may restrain or prevent lateral movement of the wafer-shaped article.

The support may maintain the wafer-shaped article in a predetermined orientation during the processing operation. For example, the support may restrict movement of the wafer-shaped article.

The gripping pin assemblies may alternatively be referred to as gripping pins.

At its most general, a gripping pin assembly may mean any part, for example an elongate part, that at least partly protrudes from the support body for gripping the wafer-shaped article, and that is rotatable relative to the support body.

The support body may have any suitable shape or configuration.

The gripping pin assemblies being rotatable relative to the support body means that each of the gripping pin assemblies can be rotated around a respective longitudinal axis of the gripping pin assembly.

The gripping pin assemblies may be independently rotatable relative to the support body. Alternatively, the gripping pin assemblies may be rotatable in synchronisation relative to the support body.

The configuration of the gripping pin assemblies is a rotational configuration of the gripping pin assemblies. A rotational configuration of the gripping pin assemblies may mean the rotational positions of all of the gripping pin assemblies.

For example, directly or indirectly detecting the configuration of the gripping pin assemblies may comprise directly or indirectly detect a rotational position of one or more of the gripping pin assemblies.

Detecting a configuration of the gripping pin assemblies may mean detecting only a single configuration of the gripping pin assemblies.

For example, the detector may be configured to directly or indirectly detect when the gripping pin assemblies are in the gripping configuration. When it is detected that the gripping pin assemblies are in the gripping configuration, it is deduced or assumed that a wafer is loaded on the support. When it is not detected that the gripping pin assemblies are in the gripping configuration, it is deduced or assumed that a wafer is not loaded on the support.

The gripping configuration may correspond to a specific rotational position of one or more of the gripping pin assemblies. Therefore, detecting that the gripping pin assemblies are in the gripping configuration may comprise directly or indirectly detecting that one or more of the gripping pin assemblies is in a specific rotational position.

Typically, the rotational positions of the gripping pin assemblies at which the wafer will be gripped by the gripping pin assemblies is predetermined in advance based on the position and/or properties of the gripping pin assemblies and the diameter of the wafer. The gripping configuration of the pin assemblies is therefore predetermined in advance.

Alternatively, the detector may be configured to directly or indirectly detect when the gripping pin assemblies are in the non-gripping configuration. When it is detected that the gripping pin assemblies are in the non-gripping configuration, it is deduced or assumed that a wafer is not loaded on the support. When it is not detected that the gripping pin assemblies are in the non-gripping configuration, it is deduced or assumed that a wafer is loaded on the support.

The non-gripping configuration may correspond to a specific rotational position of one or more of the gripping pin assemblies. Therefore, detecting that the gripping pin assemblies are in the non-gripping configuration may comprise directly or indirectly detecting that one or more of the gripping pin assemblies is in a specific rotational position.

Alternatively, the detector may be configured to detect a plurality of different configurations of the gripping pin assemblies. For example, the detector may be configured to directly or indirectly detect a plurality of different rotational positions of one or more of the gripping pin assemblies.

Many different types of detector can be used in the present invention, for example a position detector, a distance detector, a rotation detector, etc.

The detector may comprise a rotation detector for detecting an amount of rotation, or a rotational position, of one or more of the gripping pin assemblies.

Directly detecting the configuration of the gripping pin assemblies means that the detector detects a configuration of the gripping pin assemblies, for example a rotational position of one or more of the gripping pin assemblies, themselves directly.

Indirectly detecting the configuration of the gripping pin assemblies means that the detector does not detect the configuration of the gripping pin assemblies themselves directly, and instead detects something that is directly related to the configuration of the of the gripping pin assemblies. For example, the detector detects something that changes or moves in a manner that is directly related to the change or movement of the gripping pin assemblies.

The support body may comprise a rotation mechanism for driving rotation of the gripping pin assemblies relative to the support body, and the detector may be configured to directly or indirectly detect a configuration of the rotation mechanism, such as a rotational position of the rotation mechanism. Since the configuration of the rotation mechanism is directly related to the configuration of the gripping pin assemblies, directly or indirectly detecting the configuration of the rotation mechanism corresponds to indirectly detecting the configuration of the gripping pin assemblies.

The detector may comprise a rotation detector for detecting an amount of rotation, or a rotational position, of the rotation mechanism.

For example, the support body may comprise a first gear for driving rotation of the gripping pin assemblies, and the detector may be configured to directly or indirectly detect a rotational position of the first gear.

The detector may comprise a rotation detector for detecting an amount of rotation, or a rotational position, of the first gear.

The rotational position of the first gear is directly related to the rotational positions of the gripping pin assemblies, such that directly or indirectly detecting the rotational position of the first gear corresponds to indirectly detecting the rotational positions of the gripping pin assemblies.

The first gear may be a ring gear.

The first gear may be a metal gear.

Each of the gripping pin assemblies may comprise a second gear that is located inside the support body, and the first gear is meshed with each of the second gears so that rotation of the first gear causes synchronised rotation of the gripping pin assemblies.

The detector may comprise a rotatable arm, wherein rotation of the rotatable arm is directly or indirectly coupled to rotation of the gripping pin assemblies, so that the rotational position of the rotatable arm is directly related to the rotational position of the gripping pin assemblies; and the detector is configured to detect a rotational position of the rotatable arm.

Since the rotation of the rotatable arm is directly or indirectly coupled to rotation of the gripping pin assemblies, the rotational position of the rotatable arm is directly related to the rotational positions of the gripping pin assemblies. Therefore, detecting the rotational position of the rotatable arm corresponds to indirectly detecting the rotational positions of the gripping pin assemblies.

The detector may be configured to detect only a single rotational position of the rotatable arm. For example, the detector may be configured to only detect a rotational position of the rotatable arm that corresponds to the gripping configuration of the gripping pin assemblies, or alternatively that corresponds to the non-gripping configuration of the gripping pin assemblies. Alternatively, the detector may be configured to detect a plurality of different rotational positions of the rotatable arm.

Alternatively, the detector may comprise a rotatable arm, wherein rotation of the rotatable arm is directly or indirectly coupled to rotation of the first gear, so that the rotational position of the rotatable arm is directly related to the rotational position of the first gear; and the detector is configured to detect a rotational position of the rotatable arm.

Since rotation of the first gear is directly related to rotation of the gripping pin assemblies, and rotation of the rotatable arm is directly or indirectly coupled to rotation of the first gear, the rotational position of the rotatable arm is directly related to the rotational positions of the gripping pin assemblies. As above, the detector may be configured to detect only a single rotational position of the rotatable arm, or a plurality of different rotational positions.

The rotatable arm may be rotatably coupled to the support at a first rotatable connection; and the rotatable arm is rotatably coupled to the first gear at a second rotatable connection, so that rotation of the first gear causes the rotatable arm to be rotated around the first rotatable connection relative to the support.

The first rotatable connection may comprise a rotary disk and/or a bearing. Of course, other rotatable connections are possible.

The second rotatable connection may comprise a bolt mounted on the first gear. Of course, other rotatable connections are possible.

The rotatable arm may extend substantially horizontally within the support.

The first rotatable connection may allow the rotatable arm to rotate around a first substantially vertical axis relative to the support. Since the first rotatable connection is fixed to the support, the first substantially vertical axis is fixed relative to the support.

The second rotatable connection may allow the rotatable arm to rotate around a second substantially vertical axis relative to the first gear. Since the second rotatable connection is fixed to the first gear, and the first gear rotates relative to the support, the second substantially vertical axis moves relative to the support.

Rotation of the first gear relative to the support causes the second rotatable connection to move relative to the support, while the first rotatable connection remains stationary relative to the support, so that the rotatable arm is rotated around the first rotatable connection relative to the support.

The detector may be configured to detect the rotation of the rotatable arm around the first rotatable connection.

The detector may comprise a radiation source and a radiation sensor; the rotatable arm is arranged to interrupt a radiation path between the radiation source and the radiation sensor when the gripping pin assemblies are in a predetermined configuration; and the detector is configured to detect when the radiation path between the radiation source and radiation sensor is interrupted.

Therefore, the detector is configured to detect when the rotatable arm is in a specific rotational position where the rotatable arm interrupts or breaks the radiation path between the radiation source and the radiation sensor. This rotational position of the rotatable arm corresponds to a predetermined configuration of the gripping pin assemblies. For example, this rotational position of the rotatable arm may correspond to the gripping pin assemblies being in the gripping configuration, or the gripping pin assemblies being in the non-gripping configuration. Therefore, by the detector detecting that the radiation path has been interrupted or broken, the predetermined configuration of the gripping pin assemblies can be detected.

Interrupting the radiation path may comprise completely blocking the radiation path (for example so that no radiation is detected by the radiation detector) or partly blocking the radiation path (for example so that a reduced amount or intensity of radiation is detected by the radiation detector).

The detector may comprise a radiation source and a radiation sensor; the rotatable arm is arranged to block or partly block a radiation path between the radiation source and the radiation sensor when the gripping pin assemblies are in a predetermined configuration; and the detector is configured to detect when the radiation path between the radiation source and radiation sensor is blocked or partly blocked.

The radiation source and the radiation sensor may be a light source and a light sensor respectively. In that case the radiation path is a light path. The light may be visible light.

Alternatively, another type of electromagnetic radiation may be used instead of light. The radiation source, radiation sensor and radiation path may therefore be an electromagnetic radiation source, electromagnetic radiation sensor and electromagnetic radiation path.

Alternatively, the radiation source and radiation path may be a nuclear radiation source and nuclear radiation sensor. In that case the radiation path is a nuclear radiation path. For example, the nuclear radiation source may comprise a radioactive material, such as a radioactive isotope, that emits nuclear radiation such as alpha particles, beta particles or gamma rays.

The radiation path may be along a longitudinal axis of the support.

The support may comprise a longitudinal passageway for supplying a gas to the wafer-shaped article, and the radiation path may extend along the passageway. The passageway may be along a longitudinal axis of the support. For example, the passageway may connect to a gas distribution chamber as discussed above with regards to FIGS. 1 and 2, and/or to gas nozzles as discussed above with regards to FIGS. 1 and 2.

The radiation source may be below the support and the radiation sensor above the support, and the support includes a transparent window. For example, the transparent window may be in a centre of a top surface of the support.

Where the passageway is present, the transparent window is on the longitudinal axis of the passageway. In this case, the rotatable arm is located between the end of the passageway and the transparent widow.

Alternatively, the radiation source may above the support and the radiation sensor below the support, and the support includes a transparent window.

Alternatively, the radiation sensor and the radiation source may both be below the support, and the support comprises a reflector for reflecting radiation from the radiation source to the radiation sensor. In this case, the radiation source and radiation sensor may be adjacent to each other, or integrated together.

For example, the reflector may be positioned above an end of the passageway discussed above. In this case, the rotatable arm is located between the end of the passageway and the reflector.

The detector may comprise a distance measuring detector.

For example, where the detector comprises the rotatable arm, the distance measuring detector may be configured to detect a distance between the distance measuring detector and the rotatable arm.

The distance may be a distance between the distance measuring detector and a surface or the rotatable arm that changes as the rotatable arm is rotated.

For example, the distance may be a distance between the distance measuring detector and a surface of the rotatable arm that moves closer to the distance measuring detector or further away from the distance measuring detector as the rotatable arm is rotated.

The distance measuring detector may be configured to measure a distance to the rotatable arm in a direction parallel to the rotation axis of the rotatable arm; and the rotatable arm has a thickness that varies along a direction perpendicular to the rotation axis of the rotatable arm, so that rotation of the rotatable arm causes the distance between the rotatable arm and the distance measuring detector to vary based on the varying thickness of the rotatable arm.

Each of the gripping pin assemblies may comprise: a body; a second gear at a first end of the body; and a gripping part at a second end of the body for gripping the wafer-shaped article.

The gripping part may comprise a longitudinal protrusion from the second end of the body, the longitudinal protrusion being spaced apart or offset from a longitudinal axis of the gripping pin assembly. Such a spaced apart or offset longitudinal protrusion may be referred to as an eccentric longitudinal protrusion.

The gripping configuration may correspond to rotational positions of the gripping pin assemblies at which the longitudinal protrusions are each a predetermined distance away from a centre of the top surface of the chuck body. This predetermined distance is typically between a maximum possible distance between the longitudinal protrusions and the centre of the top surface and a minimum possible distance between the longitudinal protrusions and the centre of the top surface, for example as illustrated in FIG. 4B.

The gripping pin assemblies may be positioned in a circular series surrounding an area where a wafer-shaped article is to be positioned on the support, and in the gripping configuration the gripping pin assemblies are configured to make edge contact with the wafer-shaped article thereby to constrain it from lateral movement away from a pre-determined position.

The support may be a chuck surrounded by a process chamber for processing of semiconductor wafers.

The apparatus may comprise a liquid dispenser for dispensing a liquid on a surface of the wafer-shaped article supported by the support. Typically, the liquid dispenser is located above a top surface of the support and arranged to dispense the liquid on a top surface of the wafer-shaped article supported by the support.

The apparatus may be configured to apply a rotational force to the gripping pin assemblies when the gripping pin assemblies are in the gripping configuration, so that the gripping pin assemblies apply a gripping force to the wafer; and the rotational force may be arranged to rotate the gripping pin assemblies away from the gripping configuration if the wafer is lost or broken.

For example, the rotational force may be arranged to rotate the gripping pin assemblies to a non-gripping configuration. This non-gripping configuration may be the same as the previously mentioned non-gripping configuration, or a different non-gripping configuration. Alternatively, the non-gripping configuration may be a different non-gripping configuration.

Therefore, if the gripping pin assemblies are in the gripping configuration and the wafer is broken or lost, the gripping pin assemblies will rotate so as to no longer be in the gripping configuration. Therefore, the breakage or loss of the wafer can be detected by detecting that the gripping pin assemblies are no longer in the gripping configuration. For example, the rotational force may be caused by one or more springs acting on the first gear to rotate the first gear to a rotational position at which the gripping pin assemblies are not in the gripping configuration.

With this arrangement it may also be possible to detect if one or more of the gripping pin assemblies is broken, because if one or more of the gripping pin assemblies is broken this may change the configuration adopted by the gripping pin assemblies while applying the gripping force to the wafer.

The rotation mechanism, such as the first gear, may be configured to rotate the gripping pin assemblies 5 in a specific rotational direction from a first non-gripping configuration, to a gripping configuration, to a second non-gripping configuration. The second non-gripping configuration may be the same as the first non-gripping configuration, or a different non-gripping configuration. For example, the rotation mechanism, such as the first gear, may be configured to rotate the gripping pin assemblies in the specific rotational direction by 360 degrees from the non-gripping configuration back to the non-gripping configuration.

The rotation mechanism, such as the first gear, may be configured to apply a continuous rotational force to the gripping pin assemblies to rotate them in the specific rotational direction from the first non-gripping configuration to the gripping configuration to the second non-gripping configuration.

When a wafer is present on the chuck, this continuous rotational force applied to the gripping pin assemblies causes the gripping pin assemblies to grip the wafer in the gripping configuration. The gripping pin assemblies are therefore prevented from rotating further to the second non-gripping configuration by the presence of the wafer. However, if the wafer is broken or lost, the gripping pin assemblies may then be able to rotate from the gripping configuration to the second non-gripping configuration due to the continuous rotational force. This further rotation of the gripping pin assemblies from the gripping configuration to the non-gripping configuration can be detected, such that the breakage or loss of the wafer can be detected.

The support may comprise a plurality of gas nozzles in the support having outlets in a top surface of the support.

The gas nozzles may all be connected to a gas distribution chamber within the support. Therefore, gas supplied to the gas distribution chamber is dispensed through the gas nozzles to the top surface of the support from the outlets.

The outlets of the gas nozzles may be arranged on the top surface of the support in a circular arrangement around a centre of the top surface.

The outlets of the gas nozzles may all be arranged in a peripheral zone or region of the top surface of the support. The outlets of the gas nozzles may all be closer to a periphery of the top surface than a centre of the top surface.

Each of the gas nozzles may be angled outwards away from a central axis of the support. In other words, the gas nozzles may be angled radially outwards. Specifically, each of the gas nozzles may be angled so that the gas exits the outlet at an acute angle to the top surface of the support.

The outlets of the gas nozzles may be arranged on the top surface so as to be covered by a peripheral zone or region of the wafer-shaped article when the wafer-shaped article is positioned on the top surface of the support and supported by the support.

This configuration of the gas nozzles and outlets means that when a wafer-shaped article is positioned on the top surface of the support, and a compressed gas such as Nitrogen gas is supplied through the gas nozzles out of the outlets, the wafer-shaped article is held in a freely floating fashion above the top surface in a state of equilibrium on account of the vacuum or low pressure produced beneath the wafer-shaped article by the gas exiting from the outlets due to Bernoulli's principle.

The wafer-shaped article may therefore be held in a freely floating fashion above the top surface of the support supported on a gas cushion and may therefore not come into physical contact with the top surface of the support.

Gas may be supplied to the gas distribution chamber through an opening in a bottom surface of the support that leads to the gas distribution chamber. For example, a shaft having a channel or passageway for supplying the gas may be inserted into the opening.

The gripping pin assemblies may therefore be for gripping the wafer-shaped article while it is supported from beneath by the gas cushion.

However, it is not essential for the support to include such an arrangement for supporting the wafer-shaped article on a gas cushion. For example, the wafer-shaped article may instead be supported from beneath by the gripping pin assemblies so as to be spaced apart from the top surface of the support, or may be in contact with the top surface of the support.

BRIEF DESCRIPTION OF THE DRAWINGS

Embodiments of the present invention will now be discussed, by way of example only, with reference to the accompanying Figures, in which:

FIGS. 11(a) to (c) illustrate the cross-section shape of the rotatable arm in FIG. 10.

Figure 1:
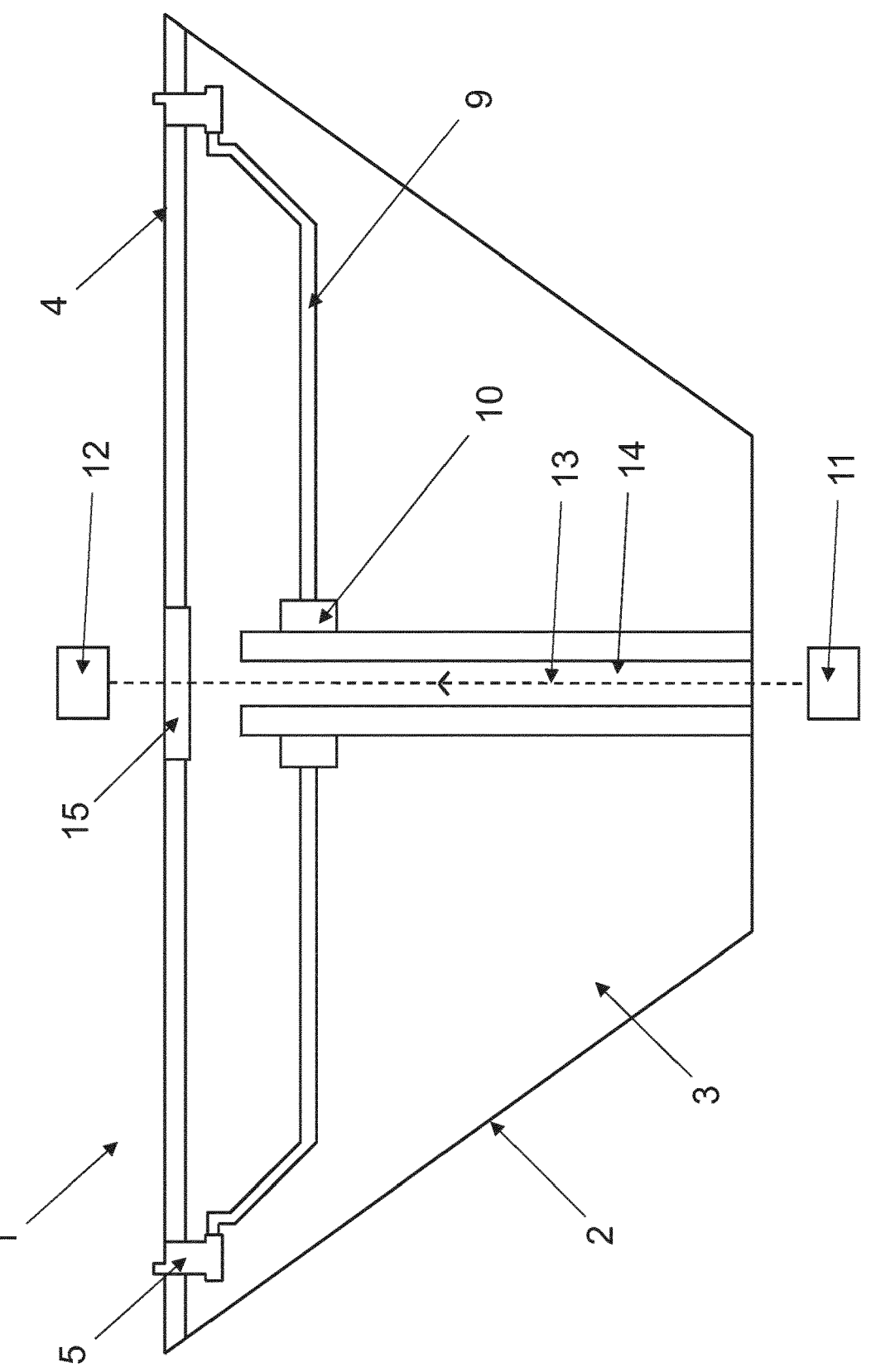
FIG. 1 is a simplified cross-sectional illustration of an apparatus for processing a wafer-shaped article that has previously been used by the applicant.
Figure 2:
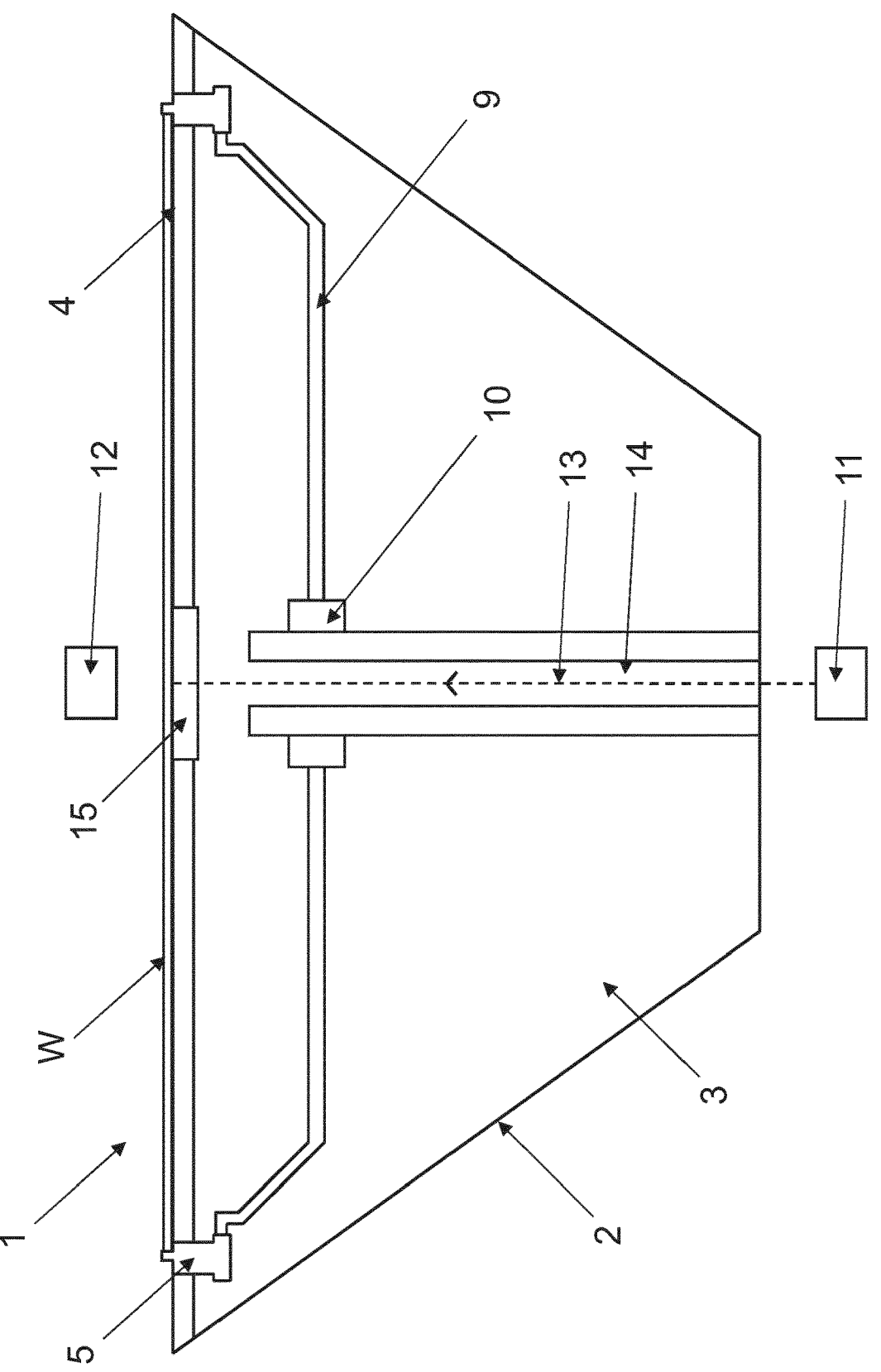
FIG. 2 shows the apparatus of FIG. 1 with a wafer present and with a second configuration of the pin assemblies.
Figure 3B:
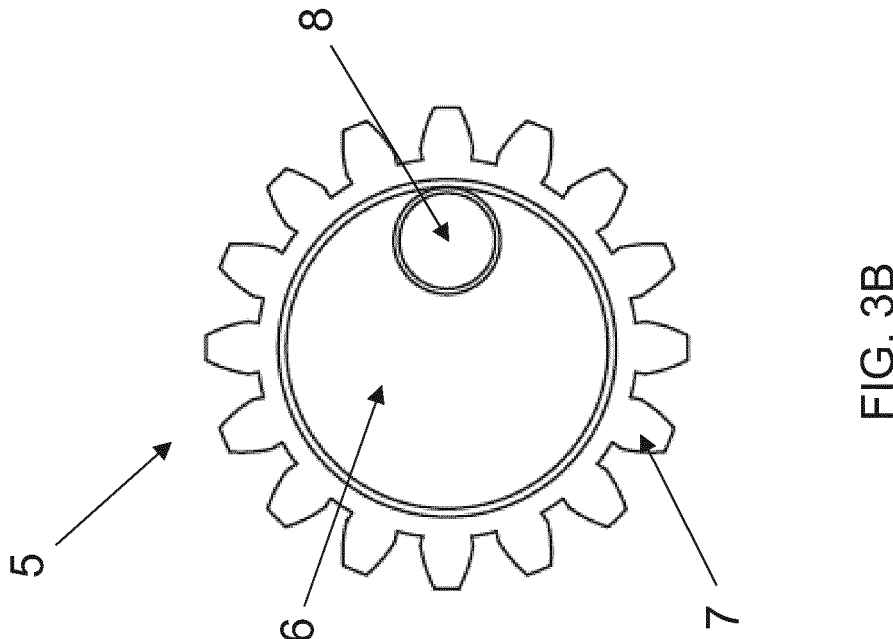
FIG. 3B is a simplified plan view of a pin assembly used in the apparatus of FIGS. 1 and 2, and that can also be used in the present invention.
Figure 3A:
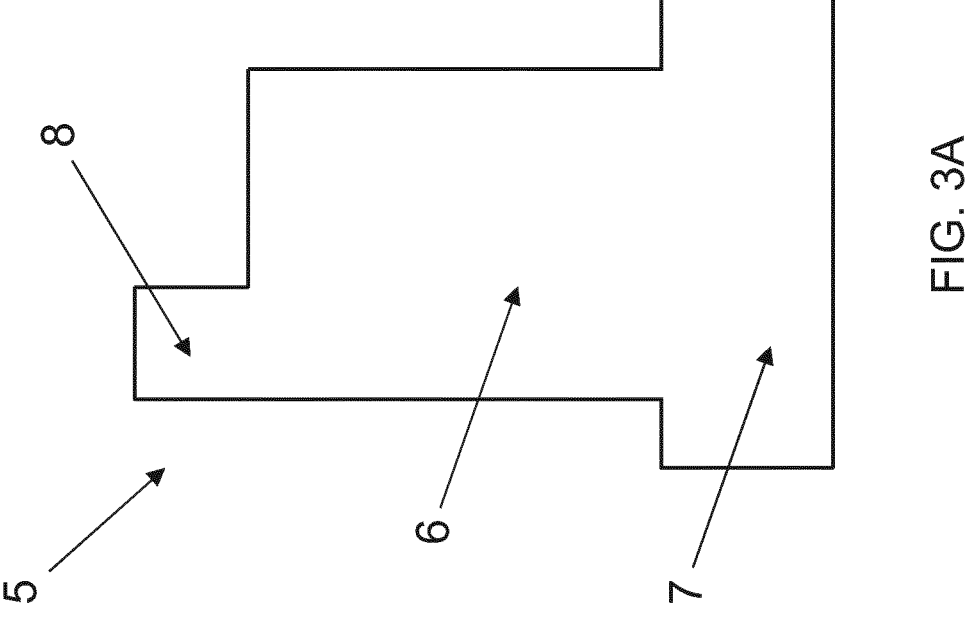
FIG. 3A is a simplified cross-section illustration of a pin assembly used in the apparatus of FIGS. 1 and 2, and that can also be used in the present invention.

DETAILED DESCRIPTION OF THE PREFERRED EMBODIMENTS AND FURTHER OPTIONAL FEATURES OF THE INVENTION

Aspects and embodiments of the present invention will now be discussed with reference to the accompanying figures. Further aspects and embodiments will be apparent to those skilled in the art.

All documents mentioned in this text are incorporated herein by reference.

An apparatus according to a first embodiment of the present invention will be described with reference to FIGS. 5 to 8.

The apparatus 16 according to the first embodiment of the present invention may include any of the features of the apparatus 1 described above and illustrated in FIGS. 1 to 4. Some of these features are indicated using the same reference signs in FIGS. 5 to 8, and description thereof is not repeated.

The apparatus 16 according to the first embodiment of the present invention differs from the apparatus 1 described above in terms of the arrangement for detecting whether or not a wafer W is present on the top surface 4 of the chuck body 3.

In particular, in the apparatus 16 it is determined whether or not a wafer W is present on the top surface 4 of the chuck body 3 by indirectly detecting a configuration of the pin assemblies 5, such as a rotational position of the pin assemblies 5.

Figure 4A:
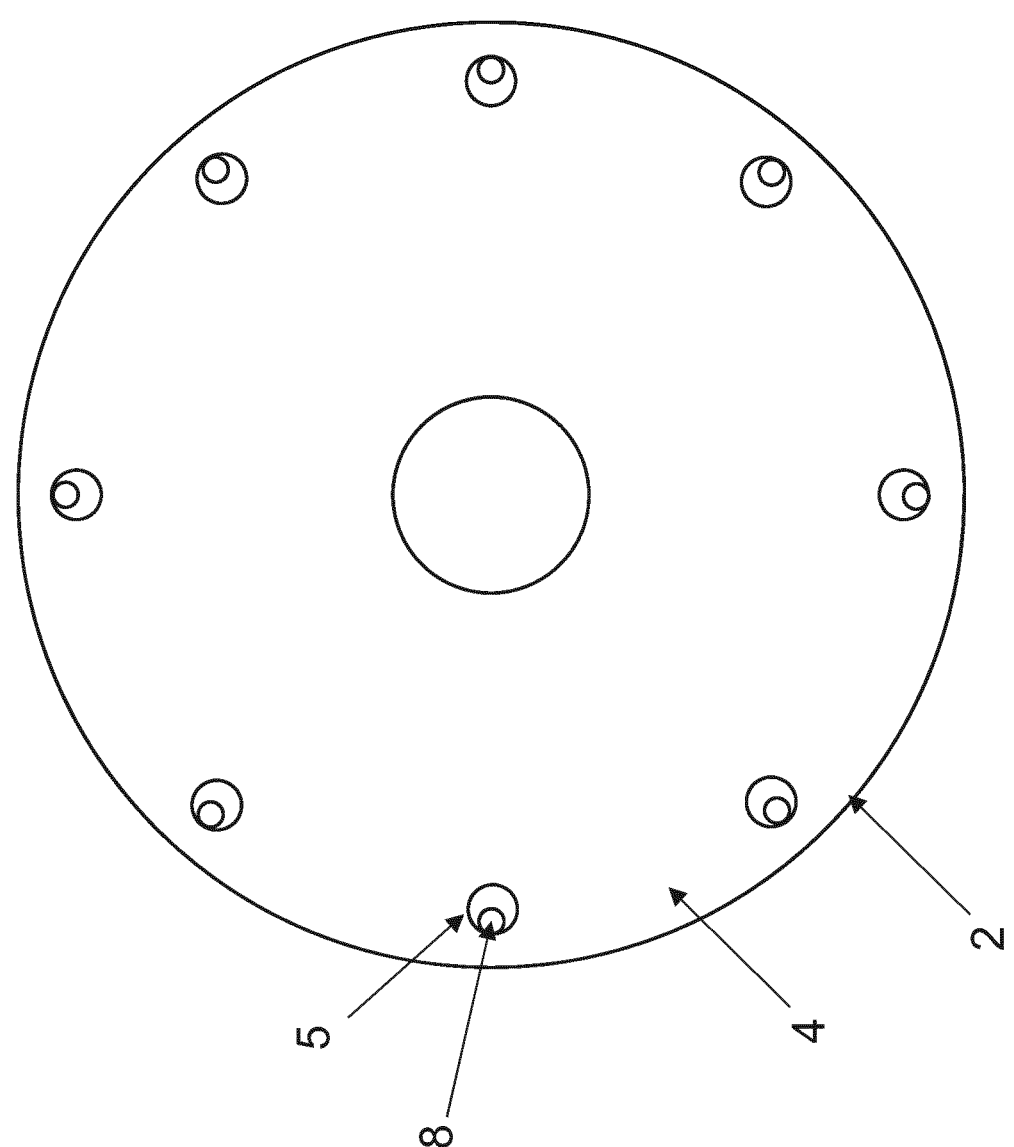
FIG. 4A is a simplified plan view of the apparatus of FIG. 1, and can also be used in the present invention.
Figure 4B:
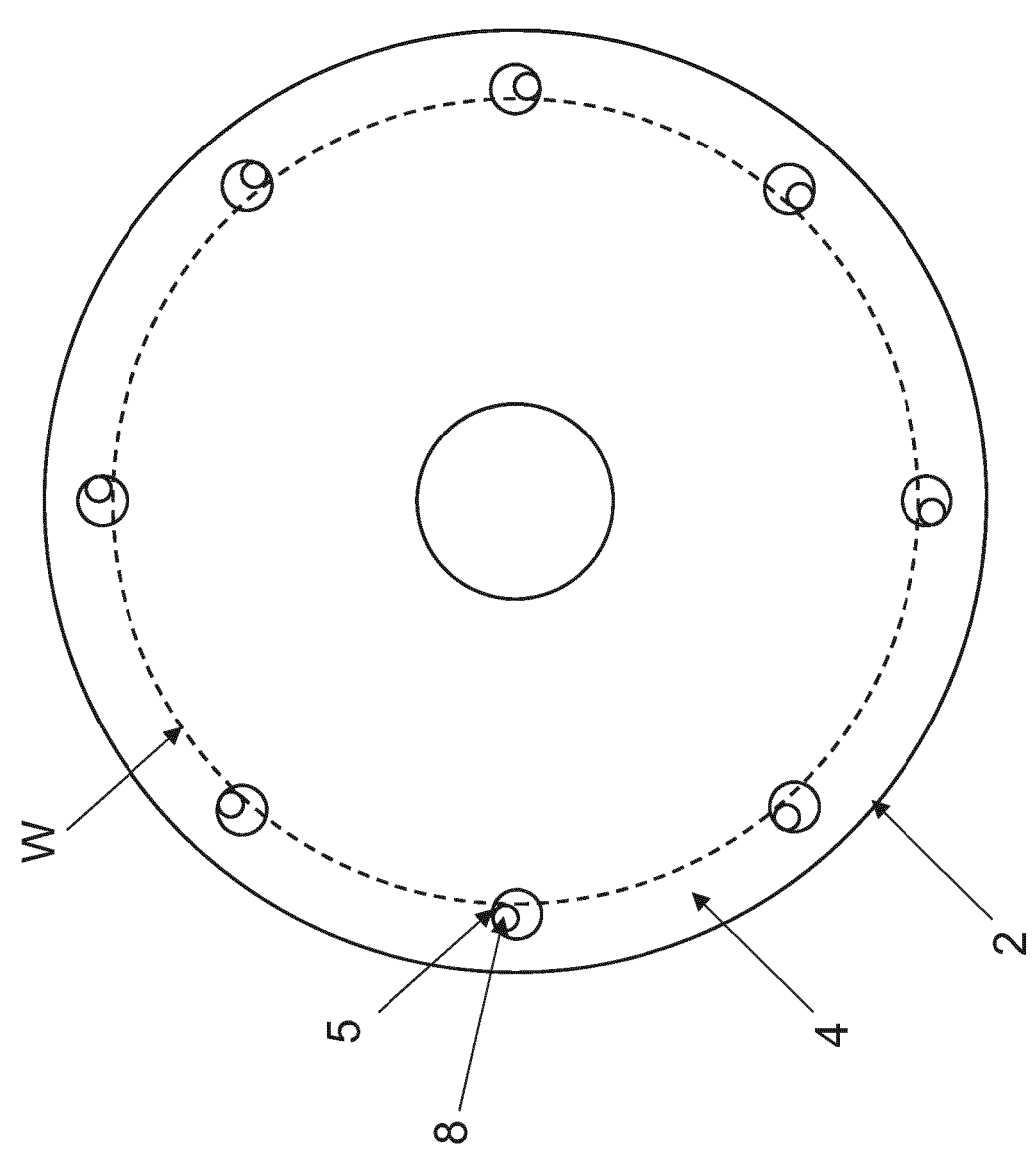
FIG. 4B is a simplified plan view of the apparatus of FIG. 1 with the second configuration of the pin assemblies, and can also be used in the present invention.
Figure 4C:
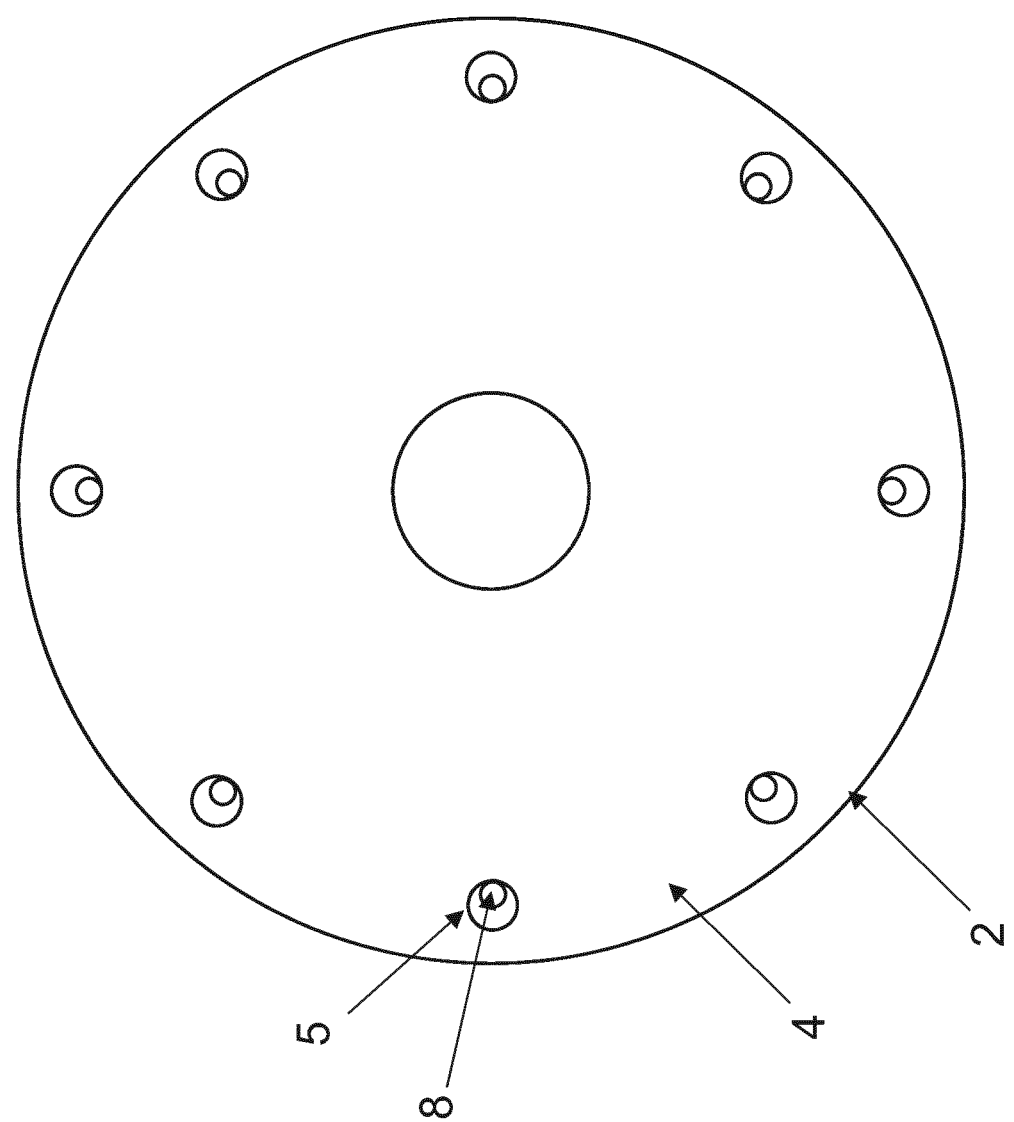
FIG. 4C is a simplified plan view of the apparatus of FIG. 1 with a third configuration of the pin assemblies, and can also be used in the present invention.

Specifically, when a wafer W is loaded on the top surface 4 of the chuck body 3, the pin assemblies 5 are rotated to a gripping configuration where the pin assemblies 5 grip the outer periphery of the wafer W (for example the configuration of the pin assemblies 5 illustrated in FIG. 4B). Therefore, by detecting that the pin assemblies 5 are in the gripping configuration (wafer-gripping rotational positions), it can be determined that the wafer W is loaded on the top surface 4 of the chuck body 3.

Conversely, when a wafer W is not loaded on the top surface 4 of the chuck body 3, the pin assemblies 5 are not in the gripping configuration (wafer-gripping rotational positions) and instead are in a non-gripping configuration (non-wafer-gripping rotational positions) (for example the configuration of the pin assemblies 5 illustrated in FIG. 4A).

Therefore, by detecting that the pin assemblies 5 are not in the gripping configuration, it can be detected that a wafer W is not loaded on the top surface 4 of the chuck body 3.

Therefore, it can be indirectly determined whether or not a wafer W is loaded on the top surface 4 of the chuck body 3 by detecting whether or not the pin assemblies 5 are in the gripping configuration (wafer-gripping rotational positions).

In embodiments of the present invention, a configuration of the pin assemblies 5, for example a rotational position of the pin assemblies 5, may be detected directly (for example by directly measuring the rotational position of the pin assemblies 5), or indirectly (for example by measuring something that is directly related to the rotational position of the pin assemblies instead of the rotational position of the pin assemblies themselves).

In embodiments of the present invention, only a single configuration, such as a single rotational position, of the pin assemblies 5 may be detected, for example that the pin assemblies 5 are in the gripping configuration (wafer-gripping rotational positions), or that the pin assemblies 5 are in non-gripping configuration (non-wafer-gripping rotational positions). Alternatively, a plurality of different configurations, for example rotational positions, of the pin assemblies 5 may be detected.

In this embodiment, a configuration or rotational position of the pin assemblies 5 is detected indirectly.

In particular, in this embodiment the apparatus 16 comprises a rotatable arm 17, wherein rotation of the rotatable arm 17 around an axis of rotation is coupled to rotation of the pin assemblies 5, so that the rotational position of the rotatable arm 17 around the axis of rotation is directly related to the rotational position of the pin assemblies 5.

The rotatable arm 17 is configured so that the rotatable arm 17 is rotated around the axis of rotation to block the light path 13 when the pin assemblies 5 are in the wafer-gripping rotational positions, and so that the rotatable arm is rotated around the axis of rotation so as not to block the light path 13 when the pin assemblies 5 are not in the wafer-gripping rotational positions. Therefore, in this embodiment it can be detected when the pin assemblies 5 are in the gripping configuration (wafer-gripping rotational positions), and when the pin assemblies 5 are not in the gripping configuration (wafer-gripping rotational positions).

Of course, the rotatable arm 17 may instead be configured so that the rotatable arm 17 is rotated around the axis of rotation to block the light path 13 when the pin assemblies 5 are not in the gripping configuration, and so that the rotatable arm 17 is rotated around the axis of rotation so as not to block the light path 13 when the pin assemblies 5 are in the gripping configuration.

In this embodiment, the rotatable arm 17 is rotatably connected to the chuck body 3 at a first rotatable connection 18, so that the rotatable arm 17 can be rotated relative to the chuck body 3 around the first rotatable connection 18. For example, the first rotatable connection 18 may comprise a rotary disk and/or bearing.

The position of the first rotatable connection 18 is fixed relative to the chuck body 3. The rotatable arm 17 is therefore rotatable relative to the chuck body 3 around an axis of rotation that passes through the first rotatable connection 18.

The rotatable arm 17 extends substantially horizontally, and the first rotatable connection 18 enables the rotatable arm 17 to be rotated around a first substantially vertical axis relative to the chuck body 3. In this embodiment, the first rotatable connection 18 is between a top surface of the rotatable arm 17 and the chuck body 3.

Furthermore, the rotatable arm 17 is also rotatably connected to the second gear 9 at a second rotatable connection 19, so that the rotatable arm 17 can be rotated relative to the second gear 9 around the second rotatable connection 19. The second rotatable connection 19 enables the rotatable arm 17 to be rotated around a second substantially vertical axis relative to the second gear 9. The position of the second substantially vertical axis is fixed relative to the second gear 9, and therefore the position of the second substantially vertical axis changes relative to the chuck body 3 as the second gear 9 is rotated. In this embodiment, the second rotatable connection 19 is between a bottom surface of the rotatable arm 17 and the second gear 9.

Figure 6:
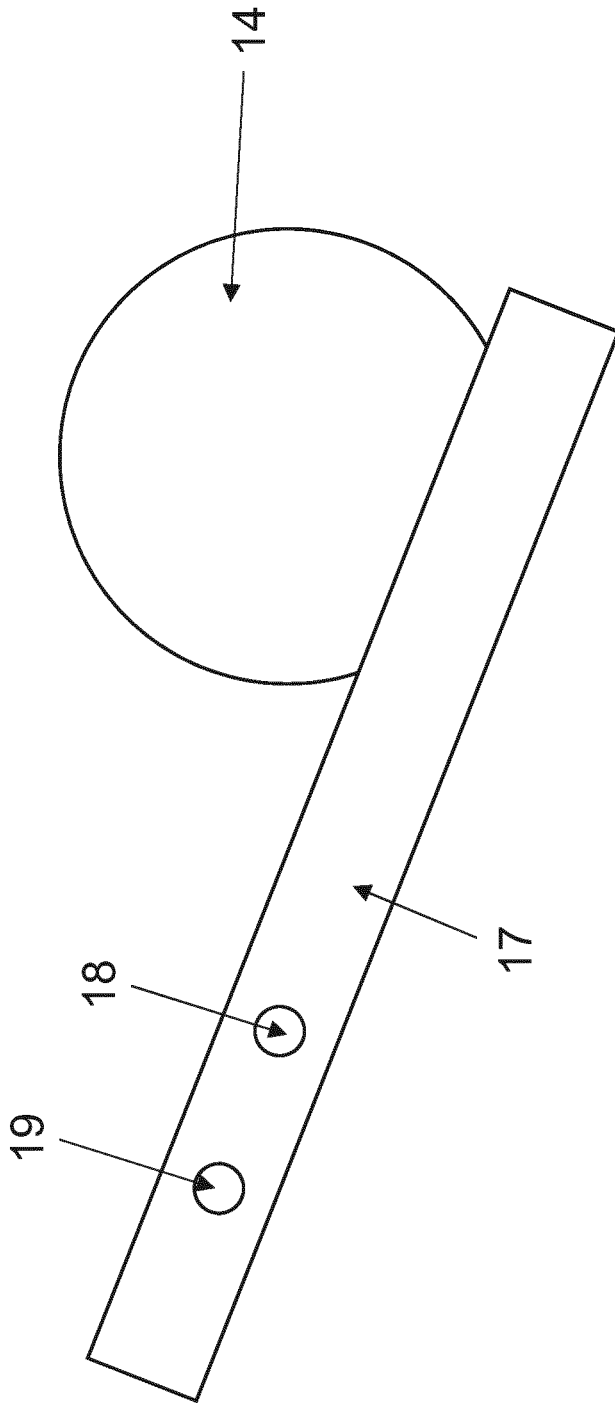
FIG. 6 is a simplified plan view of the rotatable arm in FIG. 5.
Figure 8:
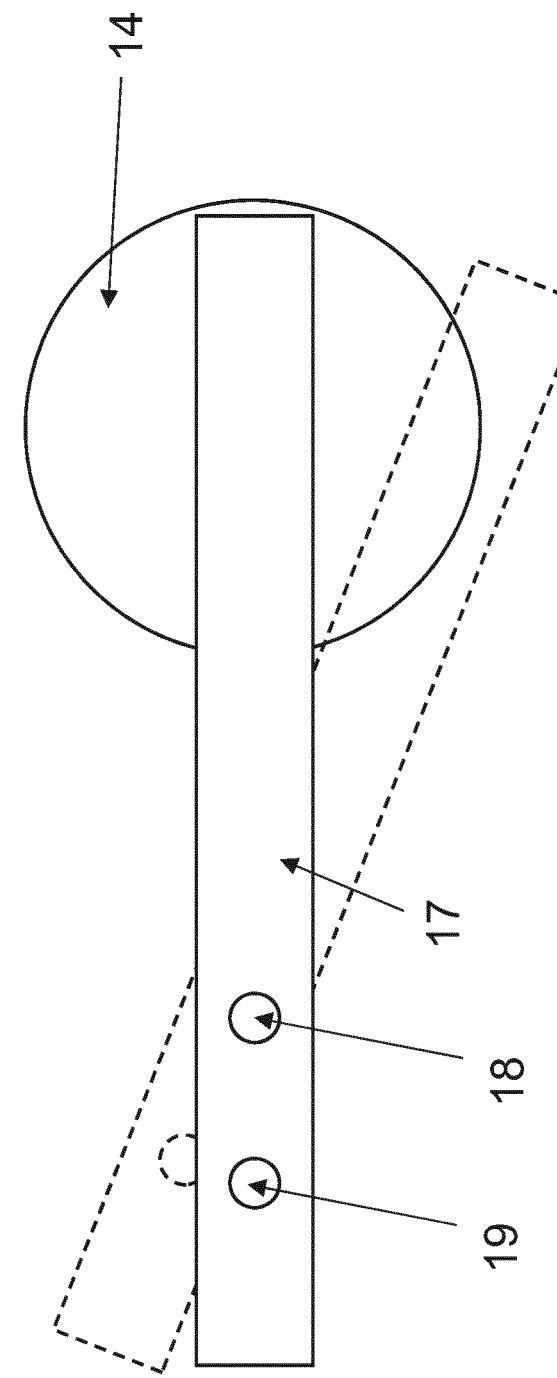
FIG. 8 is a simplified plan view of the arm in FIG. 7.

As shown in FIGS. 6 and 8, rotating the second gear 9 relative to the chuck body 3 causes the position of the second rotatable connection 19 to move relative to the chuck body 3 while the position of the first rotatable connection 18 remains fixed relative to the chuck body 3. This causes the rotatable arm 17 to be rotated around the first rotatable connection 18 relative to the chuck body 3.

The rotatable arm 17 is arranged in the chuck body 3 so that the rotatable arm 17 can be rotated around the first rotatable connection 18 to interrupt the light path 13.

Figure 5:
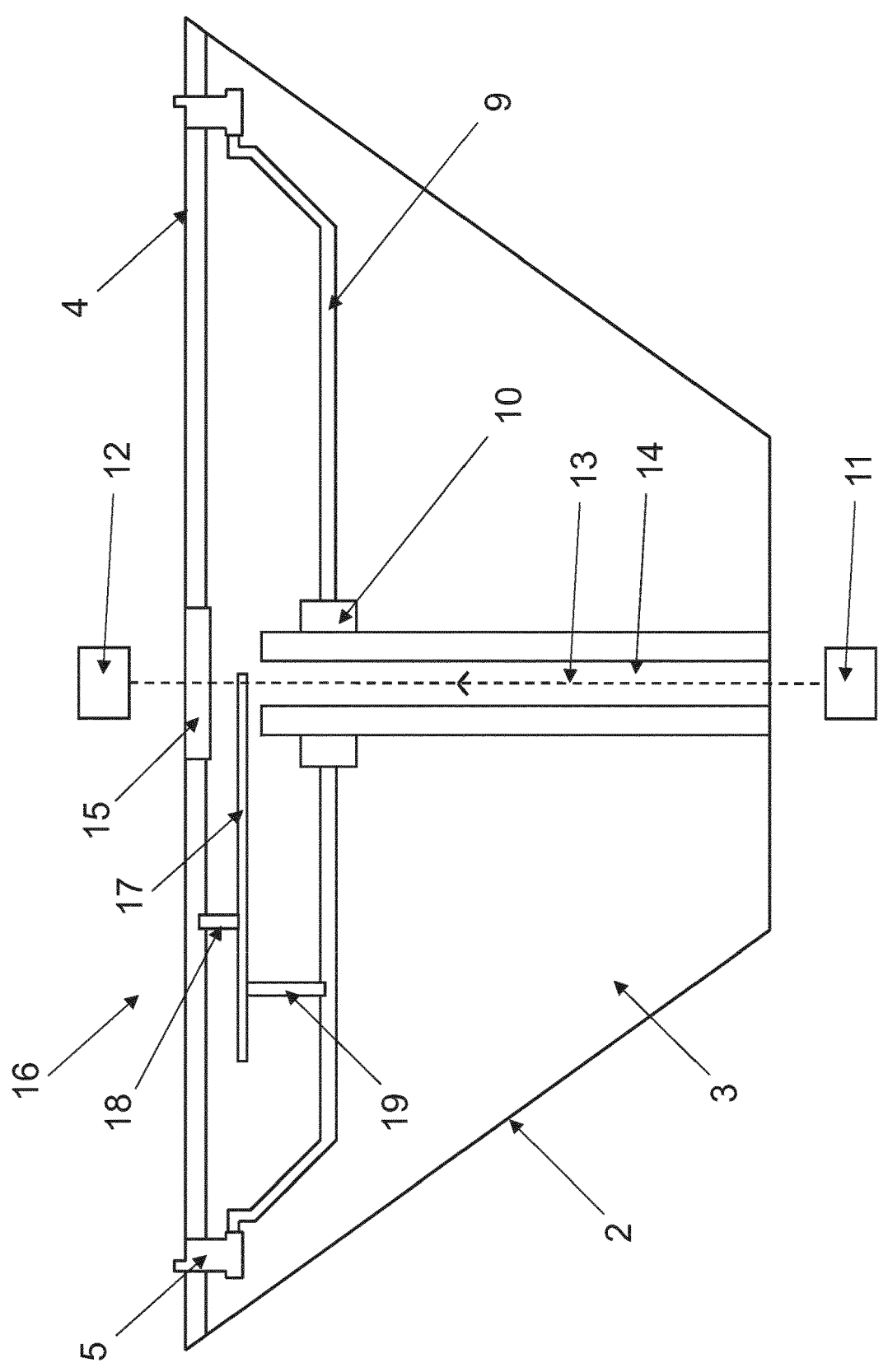
FIG. 5 is a simplified cross-sectional illustration of an apparatus for processing a wafer-shaped article according to an embodiment of the present invention.

Specifically, in this embodiment, as illustrated in FIGS. 5 and 6, when the pin assemblies 5 are not in the gripping configuration (wafer-gripping rotational positions), for example when the eccentric longitudinal protrusions 8 are located a maximum distance from the centre of the top surface 4, the rotatable arm 17 is rotationally positioned so that is does not interrupt the light path 13 after the light path 13 emerges from the distal end of the passageway 14. In particular, rotation of the second gear 9 to move the pin assemblies 5 to the non-wafer-gripping rotational positions moves the second rotatable connection 19 so as to rotate the rotatable arm 17 around the first rotatable connection 18 to a position where the rotatable arm 17 does not interrupt the light path 13.

Figure 7:
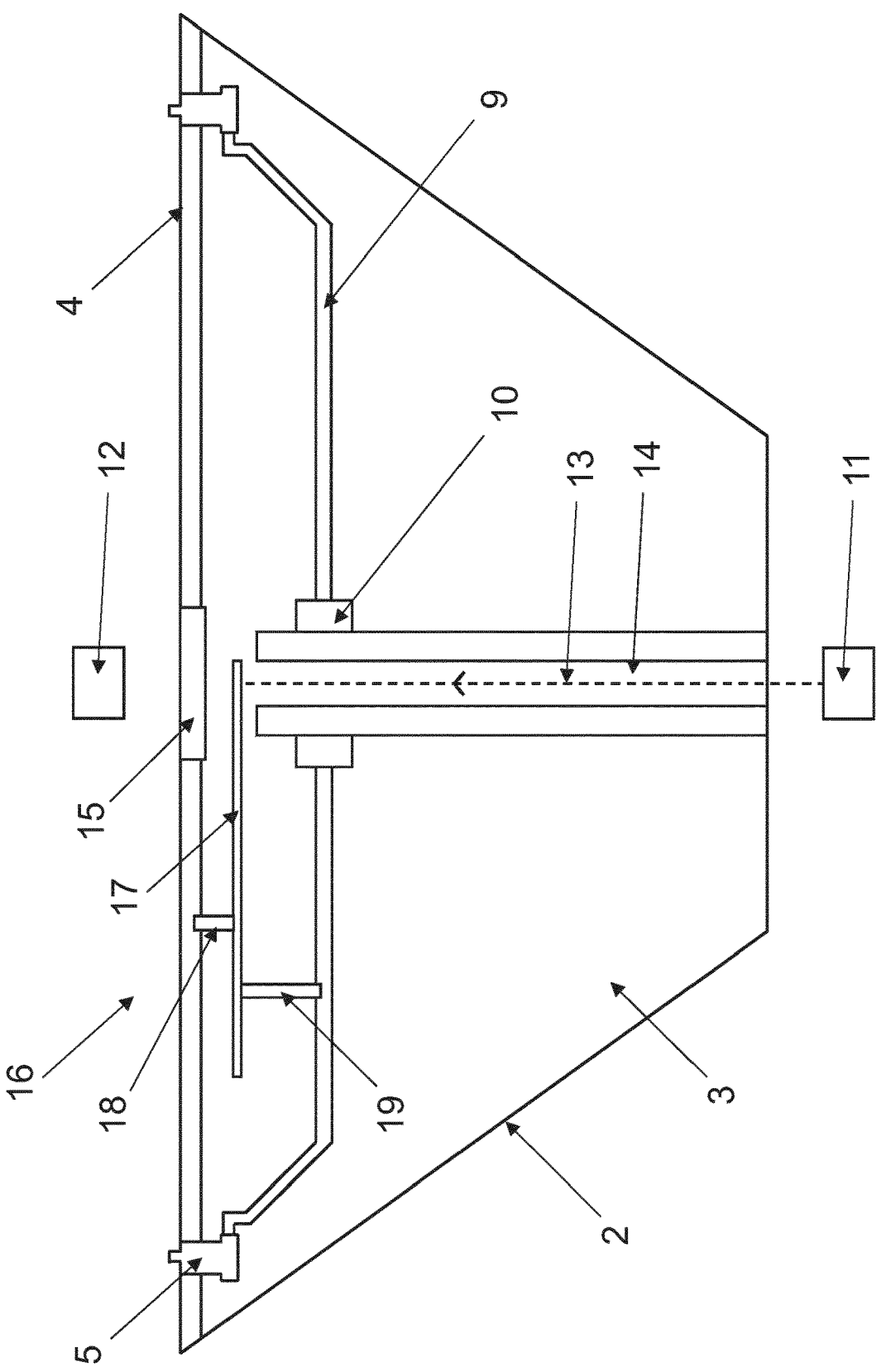
FIG. 7 shows the apparatus of FIG. 5 with a different configuration of the pin assemblies and arm.

In contrast, as illustrated in FIGS. 7 and 8, when the pin assemblies 5 are in the gripping configuration (for example where the eccentric protrusions 8 are located at a predetermined distance from the centre of the top face 4 of the chuck body 3 between the minimum distance and the maximum distance), the rotatable arm 17 is rotationally positioned so that it interrupts the light path 13 after the light path 13 emerges from the distal end of the passageway 14. In particular, rotation of the second gear 9 to move the pin assemblies 5 to the wafer-gripping rotational positions moves the second rotatable connection 19 so as to rotate the rotatable arm 17 around the first rotatable connection 18 to a position where the rotatable arm 17 interrupts the light path 13.

Specifically, rotation of the rotatable arm 17 in this embodiment is directly coupled to rotation of the second gear 9, and rotation of the second gear 9 is directly coupled to rotation of the pin assemblies 5. Therefore, detecting a rotational position of the rotatable arm 17 (whether it interrupts the light path 13 or not) indirectly detects a corresponding rotational position of the pin assemblies 5.

In this embodiment, when a wafer W is loaded on the top surface 4 of the chuck body 3 and the pin assemblies 5 are operated to grip the wafer W, the light path 13 is interrupted by the rotatable arm 17. Therefore, even if the wafer is a transparent wafer such as a glass wafer, it can be determined that a wafer has been loaded on the top surface 4 by detecting the interruption of the light path (the fact that the light sensor 12 does not detect the light from the light source 11).

In this embodiment, rotation of the second gear 9 in a specific direction may cause the pin assemblies 5 to rotate from a first non-gripping configuration, to a gripping configuration, to a second non-gripping configuration. The second non-gripping configuration may be the same as the first non-gripping configuration, or different. For example, the second gear 9 may be configured to rotate the pin assemblies 5 by 360 degrees, from a non-gripping configuration back to the same non-gripping configuration.

The second gear 9 may be configured to apply a continuous rotational force to the pin assemblies 5 to rotate the pin assemblies 5 from the first non-gripping configuration, to the gripping configuration, to the second non-gripping configuration. When a wafer W is present on the chuck 2, this continuous rotational force applied to the pin assemblies 5 causes the pin assemblies 5 to grip the wafer W in the gripping configuration. The pin assemblies 5 are therefore prevented from rotating further to the second non-gripping configuration by the presence of the wafer W. However, if the wafer W is broken or lost, the pin assemblies 5 may then be able to rotate from the gripping configuration to the second non-gripping configuration due to the continuous rotational force. This further rotation of the pin assemblies 5 means that the light path 13 is no longer interrupted by the rotatable arm 17, which means that the apparatus no longer determines that a wafer W is present on the chuck 2. Therefore, breakage or loss of the wafer W can be detected in the present embodiment.

Figure 9:
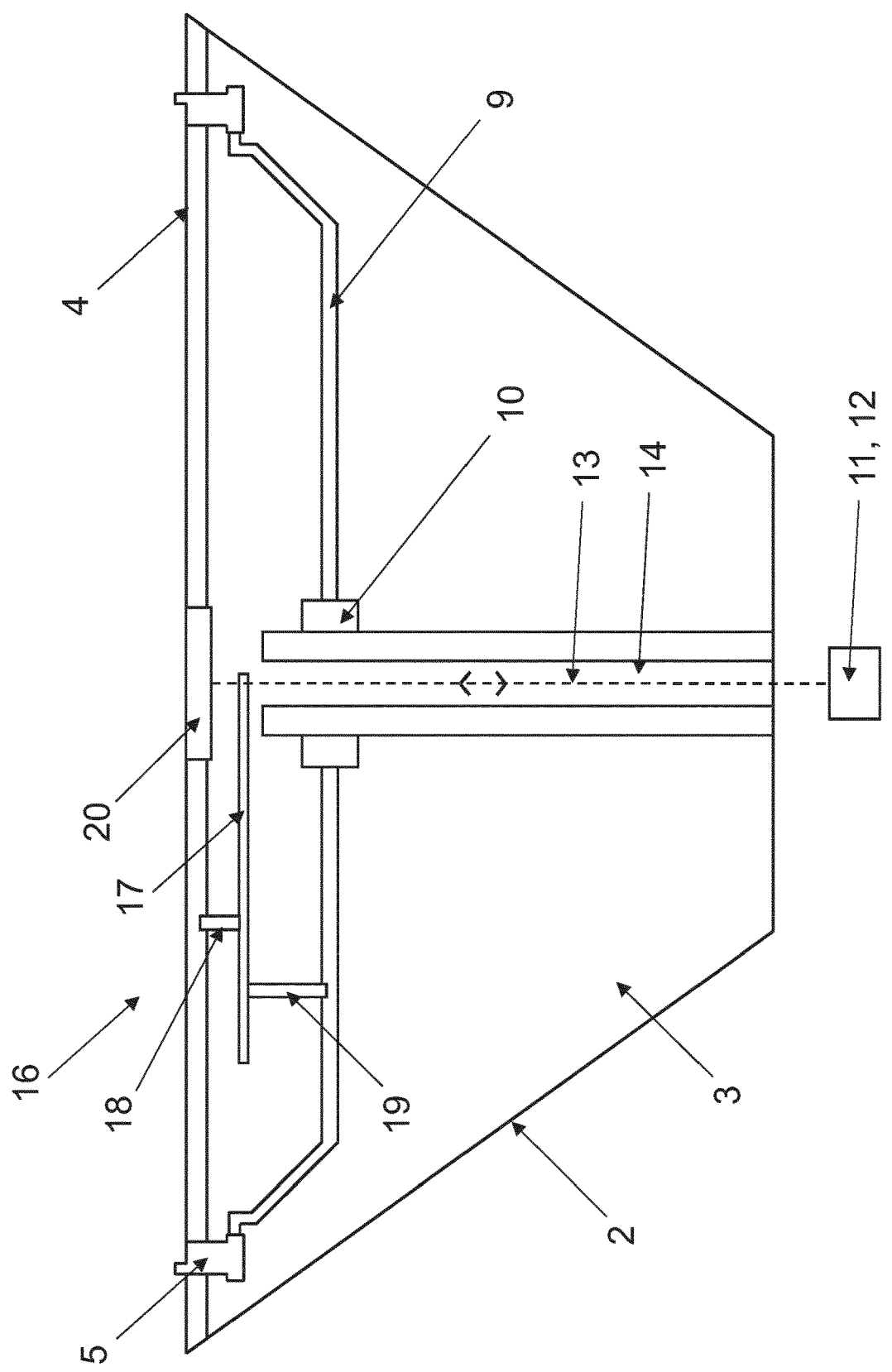
FIG. 9 is a simplified cross-sectional illustration of an apparatus for processing a wafer-shaped article according to a second embodiment of the present invention.

An apparatus according to a second embodiment of the present invention will be described with reference to FIG. 9.

The apparatus 16 according to the second embodiment of the present invention may include any of the features of the first embodiment described above and illustrated in FIGS. 5 to 8, and/or the apparatus 1 described above and illustrated in FIGS. 1 to 4. Some of these features are indicated using the same reference signs in FIG. 9, and description thereof is not repeated.

The second embodiment differs from the first embodiment in that the transparent window 15 and light sensor 12 above the chuck 2 are removed. Instead, in the second embodiment a reflector 20 is provided to reflect the light emitted by the light source 11 back towards the light source 11 and a light sensor 12 is provided below the chuck 2 for detecting the light reflected by the reflector 20. In this embodiment the light sensor 12 is provided at or adjacent to the light source 11.

The reflector 20 is provided on the longitudinal axis of the chuck 2 above the position of the arm 17. The reflector 20 is provided below the centre of the top surface 4.

The operation of the second embodiment is otherwise the same as the operation of the first embodiment. In particular, the rotatable arm 17 is rotatable to either interrupt or not interrupt the light path 13 by the rotation of the second gear 9.

As for the first embodiment, with the second embodiment even if the wafer is a transparent wafer such as a glass wafer, it can be determined that a wafer has been loaded on the top surface 4 by detecting the interruption of the light path (the fact that the light sensor 12 does not detect the light from the light source 11).

In addition, with this embodiment, liquid dispensed onto the centre of the top surface of the chuck 2 will not interrupt the light path 13, since the light path 13 is reflected by the reflector 20 below the top surface 4 of the chuck body. Therefore, incorrect detection of a wafer caused by liquid being dispensed onto the top surface 4 can be avoided with this embodiment.

Figure 10:
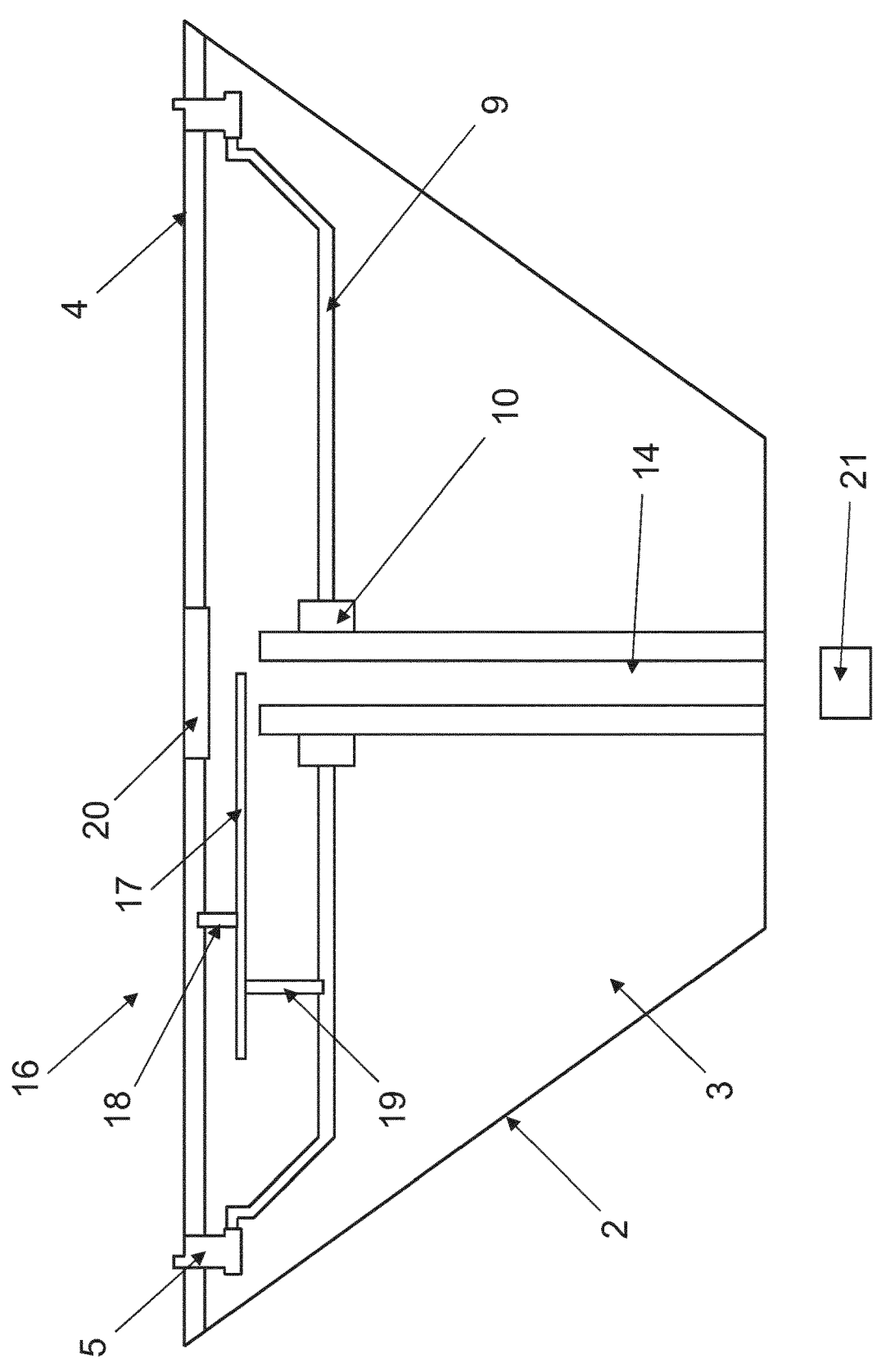
FIG. 10 is a simplified cross-sectional illustration of an apparatus for processing a wafer-shaped article according to a third embodiment of the present invention.

An apparatus according to a third embodiment of the present invention will be described with reference to FIG. 10 and FIGS. 11(*a*) to 11(*c*).

The apparatus according to the third embodiment of the present invention differs from the first and second embodiment in that the light source 11, light detector 12 and light path 13 are removed.

Instead, in this embodiment a distance measuring detector 21 is provided for measuring a distance to the rotatable arm 17. For example, the distance measuring detector 21 may bounce electromagnetic radiation of a specific frequency off of the rotatable arm 17 and calculate a distance to the rotatable arm 17 based on the time taken for the electromagnetic radiation to travel to the rotatable arm 17 and back to the distance measuring detector 21.

The apparatus according to the third embodiment may include any of the other features of the first or second embodiment, and/or the apparatus 1 described above and illustrated in FIGS. 1 to 4.

In this embodiment, the distance measuring detector 21 is positioned beneath the chuck 2 and measures a distance to the underside of the rotatable arm 17. In addition, as shown in FIGS. 11(*a*) to 11(*b*), the rotatable arm 17 has a cross-sectional shape that has a uniformly varying thickness across the width of the rotatable arm 17 (the width being along a horizontal direction perpendicular to the longitudinal direction, and the thickness being along a vertical direction perpendicular to the longitudinal direction and the width).

Therefore, as the rotatable arm 17 is rotated, the varying thickness of the rotatable arm 17 means that a distance between the rotatable arm 17 and the detector 21 varies. By detecting the distance between the detector 21 and the rotatable arm 17, the exact rotational position of the rotatable arm 17 can be precisely determined, and therefore the rotational positions of the pin assemblies 5 can also be precisely determined.

In this embodiment, the thickness of the rotatable arm 17 varies linearly across the width of the rotatable arm 17. Of course, in other embodiments a different variation in thickness may be provided instead.

Precisely determining the rotational positions of the pin assemblies 5 enables the presence of a wafer on the top surface 4 to be determined more precisely.

In addition, precisely determining the rotational positions of the pin assemblies 5 may enable changes over time of the rotational positions of the pin assemblies 5 in the wafer-gripping rotational positions to be identified. Such changes over time may indicate wear of the pins that may need to be addressed with maintenance or replacement of the pins. Such maintenance requirement can be detected by a controller and the controller can inform the operator and/or maintenance personnel.

Of course, in other embodiments a different type of detector may be used to detect the rotational position of the rotatable arm 17. For example, a detector may be provided in the chuck body 3 to detect a distance between the detector and a side face of the rotatable arm 17, wherein the side face of the rotatable arm 17 is moved closed to the detector, or further away from the detector, when the rotatable arm 17 is rotated.

In other embodiments, alternative configurations of the light path 13 may be provided. For example, the light source and light sensor may be located within the chuck body 3. In addition, or alternatively, the light path may not be substantially vertical, for example the light path may instead be provided horizontally.

In other embodiments, a different type of electromagnetic radiation, or nuclear radiation, may be used instead of light. The light source, light sensor and light path can therefore be replaced with a radiation source, radiation sensor and radiation path.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. An apparatus for processing a wafer-shaped article, the apparatus comprising a support configured to support the wafer-shaped article during a processing operation to be performed on the wafer-shaped article; wherein:

the support comprises a support body and a plurality of gripping pin assemblies adapted and positioned relative to the support body for gripping the wafer-shaped article, wherein the gripping pin assemblies are rotatable between a gripping configuration in which the gripping pin assemblies are arranged to grip the wafer-shaped article, and a non-gripping configuration in which the gripping pin assemblies are not arranged to grip the wafer-shaped article; and the apparatus comprises a detector configured to directly or indirectly detect a configuration of the gripping pin assemblies, wherein the support body comprises a second gear for driving rotation of the gripping pin assemblies, the detector is configured to directly or indirectly detect a rotational position of the second gear, each of the gripping pin assemblies comprises a first gear that is located inside the support body, and the second gear is meshed with each of the first gears so that rotation of the second gear causes synchronized rotation of the gripping pin assemblies.

2. The apparatus according to claim 1, wherein the detector is configured to directly or indirectly detect a rotational position of one or more of the gripping pin assemblies.

3. The apparatus according to claim 1, wherein:

the detector is configured to directly or indirectly detect when the gripping pin assemblies are in the gripping configuration; and/or the detector is configured to directly or indirectly detect when the gripping pin assemblies are in the non-gripping configuration.

4. The apparatus according to claim 1, wherein:

the detector comprises a rotatable arm, wherein rotation of the rotatable arm is directly or indirectly coupled to rotation of the gripping pin assemblies, so that a rotational position of the rotatable arm is directly related to rotational positions of the gripping pin assemblies; and the detector is configured to detect the rotational position of the rotatable arm.

5. The apparatus according to claim 1, wherein:

the detector comprises a rotatable arm, wherein rotation of the rotatable arm is directly or indirectly coupled to rotation of the second gear, so that the rotational position of the rotatable arm is directly related to the rotational position of the second gear; and the detector is configured to detect a rotational position of the rotatable arm.

6. The apparatus according to claim 5, wherein:

the rotatable arm is rotatably coupled to the support at a first rotatable connection; and the rotatable arm is rotatably coupled to the second gear at a second rotatable connection, so that rotation of the second gear causes the rotatable arm to be rotated around the first rotatable connection relative to the support.

7. The apparatus according to claim 4, wherein:

the detector comprises a radiation source and a radiation sensor;

the rotatable arm is arranged to interrupt a radiation path between the radiation source and the radiation sensor when the gripping pin assemblies are in a predetermined configuration; and the detector is configured to detect when the radiation path between the radiation source and radiation sensor is interrupted.

8. The apparatus according to claim 7, wherein the radiation path is along a longitudinal axis of the support.

9. The apparatus according to claim 7, wherein:

the radiation source is below the support and the radiation sensor is above the support, and the support includes a transparent window; or the radiation source is above the support and the radiation sensor is below the support, and the support includes a transparent window; or the radiation sensor and the radiation source are below the support, and the support comprises a reflector for reflecting radiation from the radiation source to the radiation sensor.

10. The apparatus according to claim 1, wherein the detector comprises a distance measuring detector.

11. The apparatus according to claim 4, wherein:

the detector comprises a distance measuring detector; and the distance measuring detector is configured to measure a distance to the rotatable arm.

12. The apparatus according to claim 11, wherein:

the distance measuring detector is configured to measure a distance to the rotatable arm in a direction parallel to a rotation axis of the rotatable arm; and the rotatable arm has a thickness that varies along a direction perpendicular to the rotation axis of the rotatable arm, so that rotation of the rotatable arm causes the distance between the rotatable arm and the distance measuring detector to vary based on the varying thickness of the rotatable arm.

13. The apparatus according to claim 1, wherein the second gear is a ring gear.

14. The apparatus according to claim 1, wherein each of the gripping pin assemblies comprises:

a body;

the first gear at a first end of the body; and a gripping part at a second end of the body for gripping the wafer-shaped article.

15. The apparatus according to claim 14, wherein the gripping part comprises a longitudinal protrusion from the second end of the body, the longitudinal protrusion being spaced apart from a longitudinal axis of the gripping pin assembly.

16. The apparatus according to claim 1, wherein the gripping pin assemblies are positioned in a circular series surrounding an area where the wafer-shaped article is to be positioned on the support, and in the gripping configuration the gripping pin assemblies are configured to make edge contact with the wafer-shaped article thereby to constrain the wafer-shaped article from lateral movement away from a pre-determined position.

17. The apparatus according to claim 1, wherein:

the apparatus is configured to apply a rotational force to the gripping pin assemblies when the gripping pin assemblies are in the gripping configuration, so that the gripping pin assemblies apply a gripping force to the wafer-shaped article; and the rotational force is arranged to rotate the gripping pin assemblies away from the gripping configuration if the wafer-shaped article is lost or broken.

\* \* \* \* \*

5